United States Patent
Anlauf et al.

[11] Patent Number: 6,104,312
[45] Date of Patent: Aug. 15, 2000

[54] DEVICE FOR ADJUSTING PARAMETERS AND/OR OPERATING CONDITIONS IN ELECTRICAL SHOP APPARATUS

[75] Inventors: Juergen Anlauf, Goeppingen; Rolf Roth, Zell, both of Germany

[73] Assignee: Robert Bosch GmbH, Stuttgart, Germany

[21] Appl. No.: 08/624,492

[22] PCT Filed: Sep. 14, 1994

[86] PCT No.: PCT/DE94/01048

§ 371 Date: Jul. 25, 1996

§ 102(e) Date: Jul. 25, 1996

[30] Foreign Application Priority Data

Oct. 4, 1993 [DE] Germany ............................ 43 33 824

[51] Int. Cl.⁷ .................................................. G08C 17/00
[52] U.S. Cl. ........................... 340/870.28; 340/820.16; 340/825.72; 455/69
[58] Field of Search .................... 340/870.16, 870.28, 340/870.3, 870.31, 870.39, 825.17, 825.72; 455/68, 69, 70, 71

[56] References Cited

FOREIGN PATENT DOCUMENTS

| 0 221 383 | 5/1987 | European Pat. Off. |
| 41 31 341 | 11/1982 | Germany |
| 93/08654 | 4/1993 | WIPO ............................ 340/825.72 |

*Primary Examiner*—Michael Horabik
*Assistant Examiner*—Albert K. Wong
*Attorney, Agent, or Firm*—Venable; George H. Spencer; Norman N. Kunitz

[57] ABSTRACT

Proposed is a device for the adjustment of parameters and/or operating conditions in electric shop apparatuses, in particular for transmitting frequency adjustment in transmitting modules for the transmission of measured values. For the power supply, the shop apparatus (31) is equipped with a chargeable storage battery (21), which can be charged via charging equipment (20) and a separate charger (22). Charging equipment (20) and charger (22) are designed for the additional transmission of adjustment signals from an adjustment unit (32). Furthermore, a control unit (16) is provided, which converts the received adjustment signals to electric switching signals for adjusting the respective parameter and/or operating conditions. With this, parameters and operating conditions can be adjusted without having to provide manual switches at the shop apparatus (31). Thus, the shop apparatus can have a hermetically sealed casing, which is not sensitive to dirt and moisture and is suitable for use under rough operating conditions in the shop.

14 Claims, 1 Drawing Sheet

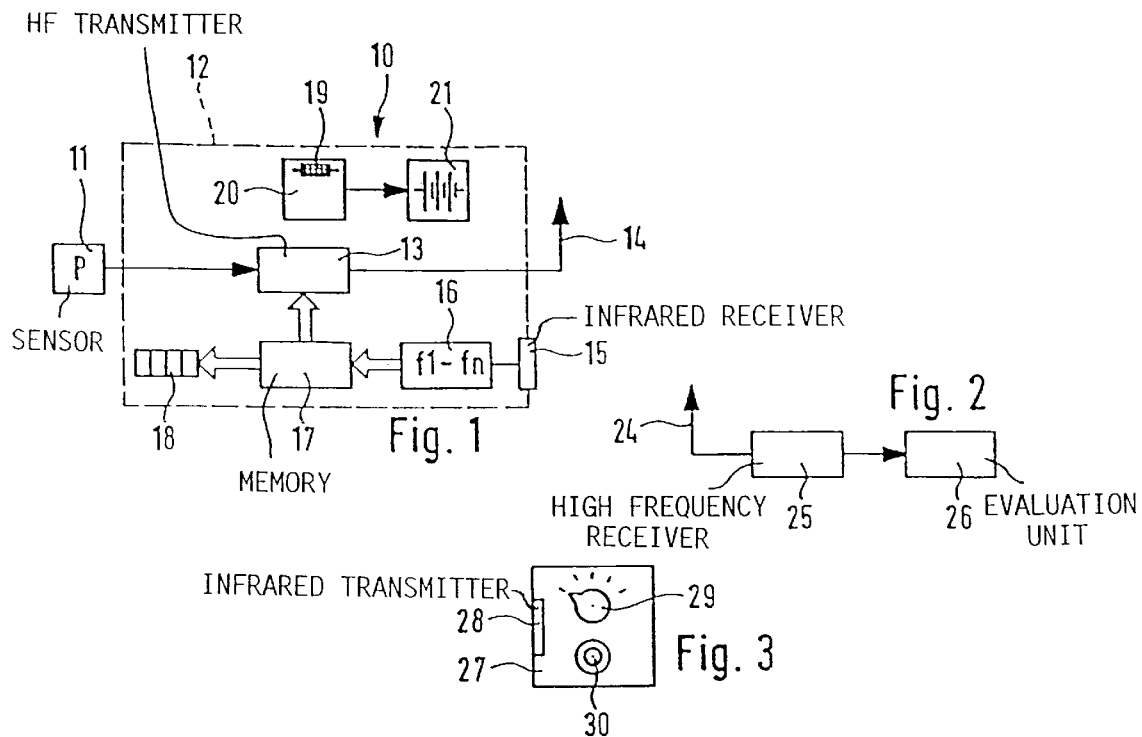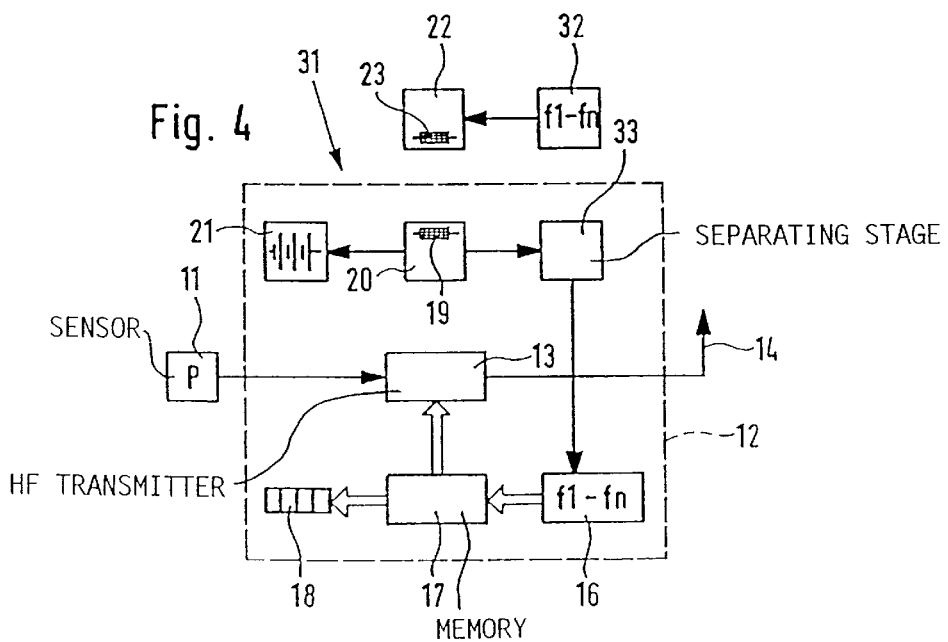

DEVICE FOR ADJUSTING PARAMETERS AND/OR OPERATING CONDITIONS IN ELECTRICAL SHOP APPARATUS

PRIOR ART

The invention relates to a device for adjusting parameters and/or operating conditions in electrical shop apparatuses, in particular for the transmitting frequency adjustment in transmitting modules, designed to transmit measured values.

The use of such devices, which are known for example from DE-OS 35 38 687 or DE-OS 41 31 341, makes sense whenever measured values must be transmitted from a mobile object, for example, a vehicle, to an evaluating station, e.g., a diagnostic unit. One preferred use is for the motor vehicle diagnosis, where the most varied measured values for real-time transmission of measured values are transmitted via a high-frequency radio link. For a brake-pressure measuring system, for example, different pressures must be recorded at various points of the brake system and transmitted for evaluation.

These devices, which are designed as transmitting modules, frequently must be tuned to various radio channels, not least also depending on the local conditions and the respective electromagnetic radiation in existence there. DIP switches, for example, are known to be used for this. However, because of their installation at the vehicle, the transmitting modules are subjected to heavy wear resulting from, among other things, dirty water, so that a careful sealing of the module housing is necessary. This contrasts with the contrary requirement of easy accessibility to the DIP switch.

This is also a requirement for other shop apparatuses, for example, self-diagnostic equipment and exhaust gas testing equipment, meaning the requirement of sealing the apparatus as hermetically as possible against dirt and spraying water, so that switches for adjusting the parameter or operating conditions are avoided, if possible, or must be installed with enough protection so that easy accessibility is no longer possible. In addition to the adjustment of transmitting frequencies, such adjustments concern, for example, also the adjustment of measuring ranges, the switching between the various measured value recordings, the switching between operating conditions (e.g. on/off) and things of that kind.

SUMMARY AND ADVANTAGES OF THE INVENTION

The above mentioned drawbacks according to the known arrangements generally are overcome according to a first aspect of the present invention by a device for the adjustment of parameters and/or operating conditions in an electric shop apparatus, in particular for this adjustment of transmitting frequencies in transmitting modules for the transmission of measured values, wherein the device comprises a control unit which emits electric switching signals for adjusting the respective parameters and/or operating conditions, and the shop apparatus has an infrared receiver for receiving adjustment signals from an infrared transmitter.

The above mentioned drawbacks according to the known arrangements generally are overcome according to a further aspect of the present invention by a device for the adjustment of parameters and/or operating conditions in an electric shop apparatus, in particular for the adjustment of transmitting frequencies in transmitting modules for the transmission of measured values, wherein the shop apparatus has a power supply incorporating a chargeable storage battery, the battery is capable of being charged via a charger device and a separate charger, the adjustment device further comprises a control unit for the electrical switching signals for the adjustment of the respective parameters and/or operating conditions, and a charger device and charger for additionally transmitting adjustment signals from an adjustment unit.

In contrast to the known devices, the advantage of the device according to the invention, as described above, is that all or most of the switches can be dispensed with and that the necessary adjustments of the parameters and/or operating conditions cain be made without touching, via infrared radiation or via the already required charging equipment for charging a storage battery, installed as part of the shop apparatus. As a result, the shop apparatus can have a hermetically sealed casing, which does not have any protruding control elements or something of that kind, which could be the cause of damages.

In case of an adjustment of parameters or operating conditions via infrared signals, the shop apparatus casing can be sealed hermetically in a simple way and needs only an optical window, which permits the infrared signals to penetrate.

When transmitting the adjustment signals via the charging equipment for the storage battery in the shop apparatus, this charging equipment can preferably be designed as a charging coil for inductive transmission of the charging current and the adjustment signals. Of course, on principle it is also possible to design the charging equipment as sealed charging plug at the shop apparatus casing.

A non-volatile memory in the shop apparatus, preferably designed as a battery-buffered RAM or EEPROM, is suitable for storing the parameters and/or operating conditions, preset by the adjustment signals.

A display at the shop apparatus casing, designed to reproduce these parameters and operating conditions, is of advantage to be able to read and monitor the adjustments that were made.

The invention at hand, above all, is suitable for shop apparatuses that are designed as transmitting modules, wherein the control equipment is designed as switching equipment for various predetermined transmitting frequencies. In order to transmit these measured values, the casing is equipped in particular with sensors for recording these measured values, such as pressure, temperature, exhaust gas composition, rotational speed, or similar values, for which the signals are fed to a transmitting device.

Exemplary embodiments of the invention are shown in the drawings and are explained in more detail in the description below.

BRIEF DESCRIPTION OF THE DRAWINGS

FIG. 1 is a block diagram of a transmitting module with infrared-controlled adjustment of the transmitting frequency.

FIG. 2 is a receiving station for receiving the measured values transmitted by the transmitting module.

FIG. 3 shows a infrared adjustment unit for wireless adjusting of transmitting frequencies for the transmitting module.

FIG. 4 shows another exemplary embodiment of a transmitting module with transmitting frequency adjustment via a charger.

DETAILED DESCRIPTION OF THE EXEMPLARY EMBODIMENTS

The transmitting module 10, shown in FIG. 1 as first exemplary embodiment, has a pressure sensor 11 for recording, for example, the braking pressure of a truck, which is to be monitored and checked. To do this, it is standard practice to attach several such transmitting modules 10 to various points on the braking system of a truck or other motor vehicle. The braking system has corresponding measuring openings for this, in particular screw holes, into which the pressure sensor or a line connected to the pressure sensor is screwed. The pressure sensor 11 here can be mounted on casing 12 of the transmitting module or can be connected to it via a line. Several such transmitting modules 10 here serve to transmit the pressure at various points, while another transmitting module 10 is used to record a reference pressure and is installed, for example, at a brake pressure hose coupling for the truck.

Pressure sensor 11 here is linked to a transmitting stage 13 inside the transmitting module 10, which has a modulator for modulating the measuring signal of pressure sensor 11 up to a high-frequency transmitting signal, which is then radiated via an antenna 14.

An infrared receiving unit 15, in the following simply called IR receiver, for example, is designed as IR receiving diode and is connected to a decoder 16, which switches between the planned transmitting frequencies f1 to fn, depending on the IR signals received, and thus functions as a switching unit. A data word that corresponds to a selected transmitting frequency is stored in the subsequently connected memory 17, which transmits this data word to transmitting stage 13 for presetting the transmitting frequency. This stage has a respective converter for this. This data word furthermore is transmitted to a display 18, where the selected transmitting frequency can be read.

Transmitting module 10 also has a charging equipment 20 with charging coil 19 for the charging of storage battery 21, which is connected so as to supply power to the individual components of transmitting module 10, a connection that is not shown here. The memory 17, for example, is designed as a RAM memory and is buffered by this storage battery 21, so that it always retains its memory contents. An EEPROM memory can, for example, also be installed in place of a battery-buffered RAM memory. The charging current is transferred inductively from a charger 22, which is shown in more detail in FIG. 4 and also has a charging coil 23, to the charging coil 19 of charging equipment 20. Of course, on principle it is possible to use for the charging a charging cable and a charging plug on casing 12 of transmitting module 10 in place of the inductive charging.

FIG. 2 shows a receiver station for the measured values that are transmitted with high frequency. It contains a receiving stage 25 with receiving antenna 24, wherein the receiving stage 25 in turn has a demodulator that is not shown and which is used to transmit the demodulated measuring signal to an evaluation unit 26, designed for example as computer.

FIG. 3 shows a diagram of an IR transmitting unit 27. It has an IR transmitter 28 which can, for example, be designed as IR transmitting diode. Furthermore, this IR transmitting unit 27 has an operating element 29 for preselecting the desired transmitting frequency, which can be adjusted in transmitting module 10. Finally, a transmitting button 30 for triggering an IR signal is also provided.

On principle, all transmitting modules 10 can operate with the same transmitting frequency, wherein this requires a cyclical polling from the receiving stage 25 or cyclical, synchronized operation. On the other hand, it is also possible to provide each transmitting module 10 with a different transmitting frequency, wherein the receiving stage 25 is then designed to receive measuring signals on different channels. Even if all transmitting modules 10 operate with the same transmitting frequency, a channel switching will still be necessary if the currently used frequency channel experiences interference. A switching may become necessary for other reasons as well.

If the transmitting frequency of transmitting module 10 is to be preset for the first time or if a preset transmitting frequency is to be changed, then the desired transmitting frequency is adjusted at the operating element 29 which, for example, is designed as rotary switch or as keyboard. An IR signal, provided with the respective information, which can for example be modified, is then transmitted with the aid of transmitting key 30 to IR receiver 15. An IR-penetrable window in the hermetically sealed casing 12 permits the reception of this IR signal. The IR signal, which is converted to an electrical signal, is decoded in the decoder 16, a data word corresponding to the desired frequency is stored in memory 17 and can be displayed via the display unit 18, so that the adjusted frequency can be read. The new transmitting frequency is simultaneously preset in transmitting stage 13 via the stored data word, so that the measured pressure values are transmitted only with this new frequency to the receiving station.

All transmitting modules 10 in use are adjusted successively to the desired transmitting frequency in this way. It is also possible to effect the start-up and shut-down of the transmitting module 10 with the aid of IR transmitter 28 or to perform still other switching operations.

FIG. 4 shows a transmitting module 31 as a second exemplary embodiment of the invention, which is modified as compared to FIG. 1. Structural components or componentry that are the same, or appear to be the same, are given the same reference numbers and are not described again. Because such transmitting modules 31 are generally stored in charging boxes following use, in order to recharge the storage battery 21, the encoding of the transmitting frequency can be done simultaneously via the charging current, so that the IR receiver 15 and thus also the IR transmitting unit 27 are no longer necessary. The charging current is transmitted inductively from the charger 22 by way of charging coils 23 and 19 to charging equipment 20 and, after being rectified, is then used to charge up storage battery 21. At the same time, an encoding information is transmitted via encoder 32 to charger 22, which information is also transmitted as dynamic signal to charging equipment 20. This charging information is separated out by way of a separating stage 33 and fed into decoder 16 in order to preset the transmitting frequency for transmitting stage 13 in the previously described way. Similarly to the IR transmitting unit 27, shown in FIG. 3, the encoder 32 can be equipped with respective control elements, which are not shown for reasons of simplification.

In place of an inductive charging of storage battery 21, charger 22 can, of course, supply the charging current in the traditional way via a charging cable to storage battery 21. In that case, the charging equipment 20 is designed as charging plug or charging jack.

The invention is not limited to transmitting modules, but can be used for other shop apparatuses as well, which should have hermetically sealed casings to avoid the effects of dirt and moisture of rough operating conditions in the shop and which for that reason should have few or no exterior, manual switching elements. Through encoding of parameters and operating conditions via infrared signals, according to the first exemplary embodiment, or via the charging equipment for the storage battery according to the second exemplary embodiment, such hermetically sealed casings can easily be realized, and the switching operations, for example for switching between measuring ranges, measured value recordings, operating conditions (on/off) and the like, can be performed in accordance with the described method for switching between transmitting frequencies.

We claim:

1. A shop apparatus transmitter module for transmitting measured values to a remote transmitter, said transmitter comprising:

a high-frequency transmitter having a signal input for receiving electrical signals corresponding to a measured value and for modulating the values onto a transmitting frequency for transmission to a remote receiver;

a control unit for emitting electrical signals for adjusting respective parameter and operating conditions of the transmitting module in accordance with received adjustment signals; and, an infrared receiver for receiving infrared adjustment signals from an external transmitter and for supplying same to said control unit to cause a desired adjustment by the switching signals of the control unit.

2. A transmitter module according to claim 1, further comprising a hermetically sealed casing for the transmitter module having an optical window which permits penetration of the infrared signals, and wherein the sensors are external of the casing.

3. A transmitter module according to claim 1, wherein said transmitter module has a hermetically sealed casing having an optical window which permits the infrared signal to penetrate.

4. A transmitter module according to claim 1, wherein said transmitter module has an electric power supply including a chargeable storage battery and a charging coil for inductively charging said battery with the aid of a separate external charger.

5. A transmitter module according to claim 1, further comprising a non-volatile memory for storing the parameters and operating conditions preset by the adjustment signals.

6. A transmitter module according to claim 5, wherein said non-volatile memory is a battery-buffered RAM or EEPROM.

7. A transmitter module according to claim 3, further comprising a display for displaying the adjusted parameters and operating conditions at the casing of the shop apparatus transmitter module.

8. A transmitter module according to claim 1, wherein said control unit is a switching unit for various preset transmitting frequencies of the shop apparatus, transmitting module and is responsive to received adjustment signals to adjust the transmitting frequency.

9. A transmitting module according to claim 8, having at least one sensor, connected to the input of the transmitter, for recording measured values of at least one of pressure, temperature, exhaust-gas composition, and rotational speed.

10. A shop apparatus transmitter module for transmitting measured values to a remote transmitter, said transmitter comprising:

a high-frequency transmitter having a signal input for receiving electrical signals corresponding to a measured value and for modulating the values onto a transmitting frequency for transmission to a remote receiver;

a control unit for emitting electrical signals for adjusting respective parameter and operating conditions of the transmitting module in accordance with received adjustment signals;

a power supply including a chargeable storage battery, and a charging circuit for receiving combined external charging signals for charging the battery and adjustment signals for the control unit; and, a signal separating circuit for separating the adjustment signals from the charging signals and for supplying same to said control unit to cause a desired adjustment by the switching signals of the control unit.

11. A transmitter module according to claim 10, wherein said charger device has a charging coil for inductive transmission of the charging current and the adjustment signals.

12. A transmitter module according to claim 10, wherein said control unit is a switching unit for various preset transmitting frequencies of the shop apparatus, transmitting module and is responsive to received adjustment signals to adjust the transmitting frequency.

13. A transmitting module according to claim 12 having at least one sensor connected to the input of the transmitter for recording measured values of at least one of pressure, temperature, exhaust-gas composition, and rotational speed.

14. A transmitter module having: a sensor for measuring external values and for producing data; a high frequency transmitter for receiving the data and for modulating the data onto a transmitting frequency for transmitting the data; a controller for controlling the gathering of the data and the transmitting frequency; and an infrared receiver having an output coupled to the controller for receiving external infrared control signals for adjusting the controller and for determining the transmitting frequency.

* * * * *